United States Patent [19]

Grunthaner et al.

[11] Patent Number: 5,094,974
[45] Date of Patent: Mar. 10, 1992

[54] GROWTH OF III-V FILMS BY CONTROL OF MBE GROWTH FRONT STOICHIOMETRY

[75] Inventors: Frank J. Grunthaner, Glendale; John K. Liu, Pasadena; Bruce R. Hancock, Altadena, all of Calif.

[73] Assignee: The United States of America as represented by the Administrator of the National Aeronautics and Space Administration, Washington, D.C.

[21] Appl. No.: 488,578

[22] Filed: Feb. 28, 1990

[51] Int. Cl.$^5$ .................. H01L 21/36; H01L 21/363
[52] U.S. Cl. .................................... 437/85; 437/105; 437/107; 437/133; 437/936; 437/945; 148/DIG. 22; 148/DIG. 25; 148/DIG. 169
[58] Field of Search .................. 148/DIG. 5, 18, 22, 148/25, 48, 56, 65, 72, 97, 110, 119, 129, 160, 169, 33, 33.1, 33.4; 156/610-615; 427/255.1, 248.1; 437/81, 85, 105, 107, 108, 110, 111, 126, 133, 247, 936, 939, 945, 946, 949, 976

[56] References Cited

U.S. PATENT DOCUMENTS

| | | | |
|---|---|---|---|
| 4,058,430 | 11/1977 | Suntola et al. | 437/105 |
| 4,575,462 | 3/1986 | Dobson et al. | 437/107 |
| 4,829,022 | 5/1989 | Kobayashi et al. | 437/110 |
| 4,833,101 | 5/1989 | Fujii | 437/107 |
| 4,843,029 | 6/1989 | Joyce et al. | 437/107 |
| 4,933,300 | 6/1990 | Koinuma et al. | 437/110 |

OTHER PUBLICATIONS

Pessa et al., "Atomic Layer Epitaxy and . . . of CdTe Films Grounan CdTe . . . ", J. Appl. Phys. 54(10), Oct. 1983, pp. 6047-6050.
Takeda et al., "Atomic-Layer Epitaxy of ZnSe and ZnTe . . . ", Extended Abs. 17th Conf. Solid State Devices & Mat., Tokyo, 1985, pp. 221-224.
Briones et al., "Low-Temperature Growth of AlAs/GaAs Heterostructures by Modulated Molecular Beam Epitaxy", Jpns. J. Appl. Phys., vol. 26, No. 7, Jul. 1987, pp. L1125-L1127.
Sakaki et al., "One Atomic Layer . . . by Insertion of Smoothing Period in Molecular Beam Epitaxy", Jpn. J. Appl. Phys., vol. 24, No. 6, Jun., 1985, pp. L417-L420.

Primary Examiner—Olik Chaudhuri
Assistant Examiner—M. Wilczewski
Attorney, Agent, or Firm—Thomas H. Jones; John R. Manning

[57] ABSTRACT

For the growth of strain-layer materials and high quality single and multiple quantum wells, the instantaneous control of growth front stoichiometry is critical. The process of the invention adjusts the offset or phase of MBE control shutters to program the instantaneous arrival or flux rate of In and As$_4$ reactants to grow InAs. The interrupted growth of first In, then As$_4$, is also a key feature.

9 Claims, 2 Drawing Sheets

GROWTH OF III-V FILMS BY CONTROL OF MBE GROWTH FRONT STOICHIOMETRY

ORIGIN OF THE INVENTION

The invention described herein was made in the performance of work under a NASA contract, and is subject to the provisions of Public Law 96-517 (35 U.S.C. 202) in which the Contractor has elected not to retain title.

TECHNICAL FIELD

The invention relates to the growth of strain-layer materials and high quality single and multiple quantum wells, and, more particularly, to the molecular beam epitaxy (MBE) growth of films of such materials.

BACKGROUND ART

In the field of growth of strain-layer materials and high quality single and multiple quantum wells by use of epitaxial growth, lattice mismatched epitaxy is very difficult. Continuous MBE, MOCVD (metal organic chemical vapor deposition or LPE growth gives high defect density, interdiffusion between layers and three-dimensionally roughened surface film morphology.

STATEMENT OF THE INVENTION

Accordingly, it is an object of the invention to provide a method for the growth of strain-layer films having low defect density and relatively smooth surface film morphology, with minimal interdiffusion between layers.

It is another object of the invention to extend the effective critical thickness of such layers to realize the maximum thickness of such metastable layers.

In accordance with the invention, control of the defect density and effective contact angle of growing the film is achieved by controlling the instantaneous stoichiometry and surface reconstruction. This control is achieved by instantaneous measurement of stoichiometry or lattice constants by synchronizing a series of delays in MBE shutter operation with an in situ RHEED (reflective high energy electron diffraction) system.

DETAILED DESCRIPTION OF THE INVENTION

Figure 1:
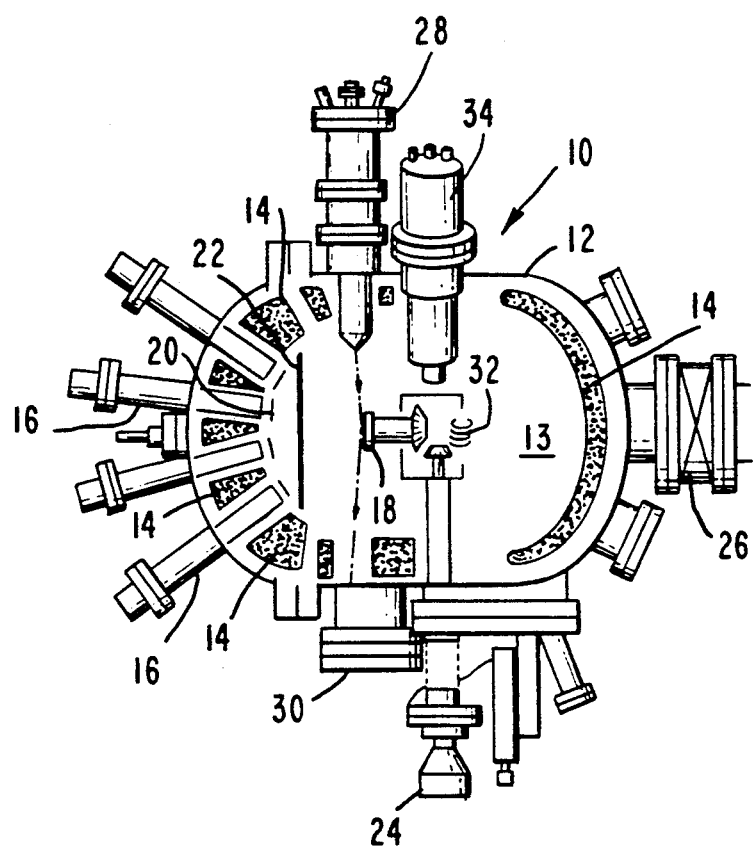
FIG. 1 is a schematic view of molecular beam epitaxy apparatus useful in the practice of the invention.

Referring now to the drawings, wherein like reference numerals designate like elements throughout, FIG. 1 depicts molecular beam epitaxy (MBE) apparatus 10 useful in the practice of the invention. Such apparatus is commercially available, though customized to particular needs, such as from Riber (Edison, NJ).

Essentially, the apparatus 10 comprises a housing 12, which defines a chamber 13. Within the housing 12 is a cryopanel 14, or liquid nitrogen shroud, surrounding the entire deposition area 13 to ensure clean, high vacuum. The cryopanel shrouding also isolates each effusion cell 16 to prevent thermal interference and cross contamination between cells.

A plurality of effusion cells 16 are used to introduce specific elements. Typically, heating means (not shown) in each cell 16 are used to generate a vapor of the element in that cell, which is directed toward a sample substrate 18. Individual shutters 20 control the extent of exposure of the substrate 18 to a particular element emanating from a cell 16. The shutters 20 controllably rotate into and out of position to block or open the aperture from the effusion cells 16. A main shutter 22 isolates the substrate 18 from all effusion cells 16.

The relative position of the sample 18 is controlled by a position control manipulator 24, which the operator controls. The sample is introduced into the apparatus 10 through a gate valve 26, such as by a track means (not shown).

A RHEED (reflective high energy electron diffraction) gun 28 is positioned to provide grazing angle analysis of the substrate 18. A fluorescent screen 30 is positioned to intercept scattered electrons from the sample 18 and provide real-time analysis of the nature of the film being grown.

An ion gauge 32 is used to measure the relative intensity of the molecular beams when the gauge is rotated into the growth position (by the position control manipulator 24).

A quadrupole mass spectrometer 34 is used to measure the background chamber gas impurities.

An ultra-high vacuum ($P > 10^{-12}$ Torr base pressure) is pulled on the chamber 13, as is conventional.

For some time, we have known that the actual instantaneous flux ratios of In to As have been critical to the control of defect generation in the lattice mismatched epitaxy of InAs on GaAs (100) or (111) substrates. We have attempted to control this problem by interrupted growth pulses so that we could grow in a metal stabilized condition without accumulating excess elemental indium in the film. We have also observed that the precise delivery of integral monolayers of Group III material (e.g., In) also strongly effects the generation of misfit dislocations and the change of the growth mode from a two-dimensional (layer by layer) to a three-dimensional islanded or faceted mode.

Recently, we discovered that by introducing small delay times in the relative opening sequence of our shutter operation program, we could control the effective In to As ratio throughout the monolayer growth cycle. The problem is complicated by the requirement for atomically smooth growth surfaces which necessitated the introduction of short wait cycles or annealing sequences. After these interruptions, the surface has reverted to an arsenic stable form because of the background As pressure in the MBE chambers. This gives rise to a monolayer coverage of elemental arsenic on the growth surface. By adjusting the relative time by which the In shutter leads the opening of the $As_4$ source shutter, we can consume the starting layer of arsenic without developing an excess of In during the growth of the second monolayer.

By analyzing the surface lattice constant of the film during these shutter operation programs, we can analyze the generation rate of misfit and other strain relieving dislocations by holding the lattice constant of InAs in the growth plane to that of the substrate. By studying the intensity ratios of In to As and Ga as determined by Auger electron spectroscopy, in structures consisting of x monolayers of InAs followed by y monolayers of GaAs where x = 1 to 30 and y = 2 to 30, with y ≥ x for all structures, we can determine the uniformity of the strained film, possible interdiffusion, and local atomic morphology. In these experiments, we have varied the appropriate delays between In, As and Ga shutters and have found a strong variation in the converge or quality of the InAs film.

Delay times range from about 0.1 to 10 seconds with equivalent fluxes of 0.5 to 1.0 monolayers per second. The delay sequence is determined by analysis of the intensity and reconstruction changes in the RHEED pattern and by the coverage results from Auger electron spectroscopic analysis.

Figure 2:
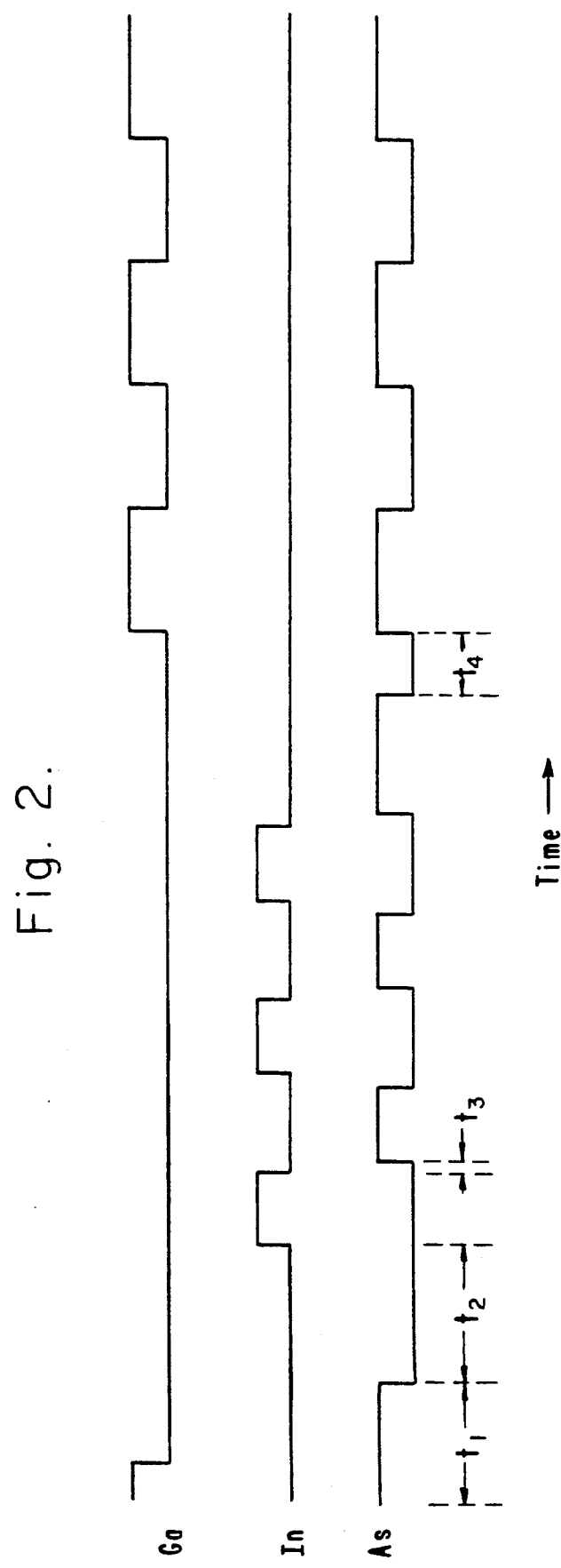
FIG. 2 is a time plot of shutter opening and closing, depicting a sequence of depositing a plurality of InAs layers.

FIG. 2 depicts the process of the invention, first introducing both Ga and As onto the surface, then turning the Ga shutter off and smoothing the surface with As (As shutter on; $t_1$), then turning the $As_4$ shutter off for a period of time to permit equilibration of As surface stoichiometry ($t_2$), then turning the In shutter on for a period of time, then turning the In shutter off, then delaying for a period of time to establish InAs stoichiometry ($t_3$), then turning on the $As_4$ shutter. The In and $As_4$ shutters are alternately opened and closed, with a time delay ($t_3$) between turning off one shutter and opening the other.

The value of $t_1$ is typically several seconds. The initial Ga is only a short pulse, about 0.1 to 0.5 sec, corresponding to about 0.01 to 0.5 monolayers of Ga, depending on Ga cell temperature and corresponding flux rate. For this range, the Ga deposition rate varies from about 0.1 to 1.0 ML/sec. The pulse length is determined by maximizing the RHEED specular beam intensity immediately after the pulse. This cycle gives the smoothest possible template for growth.

The In cell is shuttered on for the deposition of 2 monolayers of In. The typical shutter time is about 0.9 to 4 sec, depending on cell flux.

The As shutter is triggered on with a delay time of about 0.2 to 3 sec, depending on the actual flux. The delay will correspond to up to one monolayer of $As_4$. This initial time is used to react In with the residual elemental As overlayer. Subsequent As cell opening times establish InAs stoichiometry and finish with one excess As monolayer. These times range from about 0.2 to 2 sec.

After depositing a plurality of InAs layers, ending with the As shutter on, and then turned off for a period of time ($t_4$) to obtain smoothing of the surface, a plurality of GaAs layers is next deposited. The delay time ranges from about 0.5 sec to 2 min, depending on substrate temperature. The time is determined by maximizing the RHEED specular beam intensity for a given set of experimental conditions. Here, both the Ga and As shutters may be simultaneously turned on and off. The time period for the shutters being on is about 0.2 to 4 sec, while the time period for the shutters being off is about 0.2 to 120 sec.

After depositing a plurality of GaAs layers, the process is repeated for the deposition of a plurality of InAs layers, and so forth.

The control of the In, Ga, and As shutters is mechanically limited. Accordingly, precise control of In, Ga and As is achieved by opening the shutters for the minimum time possible, while controlling the flux of the elemental gun behind the shutter by temperature control. An increase in cell temperature of 5° C. doubles the flux.

In the typical Riber apparatus, the minimum shutter opening and closing times are 120 msec each. Other commercial apparatus may vary.

Thus, the shutter times and delay times are partially determined by the flux of the particular species being deposited, which in turn is determined by the temperature of the species in the cell.

The temperature of the substrate is also important in the deposition, and may range from about 250° to 575° C., with lower temperatures being preferred.

The deposition times are conveniently determined by monitoring the RHEED specular beam intensity; the preferred times correspond to the maximum specular beam intensity.

The actual optimal delay is related to the number of surface arsenic, gallium and indium atoms involved in any particular growth. These numbers depend on the actual atomic roughness of the growth surface, the effective lattice constant of the growing film, and the misoreintation of the substrate surface from the <100-> or <111> direction.

All values are affected by surface cleanliness, real surface temperature of the substrate and the background contamination level of the MBE growth systems and must be determined by real time RHEED analysis.

Additional complications come from temperature transients in the source cells caused by the rapid shuttering sequence. These again can be optimized by the RHEED analytical approach.

Samples grown by conventional techniques would have a local variation in well width of 1 monolayer to 10 monolayers for a 2 monolayer (ML) thick film. This gives a wide variety of quantum well thicknesses — each with different resonant optical and electrical levels. Photoluminescence results on 2 ml InAs quantum wells grown with 200 Å GaAs cap on (100) GaAs substrates show sharp lines consistent with uniform film thicknesses (>95% of film is 2 ml thick).

The experimental procedure to realize these films depends strongly on a series of repetitive InAs nucleations, each monitored by RHEED determining the specular intensity and the surface lattice constant variations. Ordinarily, this would involve a particularly large number of substrate preparations. In this method, we grow an extensive GaAs buffer layer of 1 to 2 micrometers thickness, then smooth the surface under appropriate $As_4$ flux as described. We then deposit thin films of InAs of up to 10 monolayers, L followed by up to 8 monolayers of GaAs with a specific set of experimental parameters (substrate temperature, Ga, In, and As flux, appropriate delay times). The sample is then heated to 625° C. under $As_4$ to desorb the InAs and GaAs overlayer films. A new buffer layer of approximately 30 monolayers is grown as a reference temperature related to the experiment and the procedure then repeated as if a new substrate were involved. This sequence involves approximately 30 minutes per cycle. After growth calibration, the final films are then grown. Analysis by RHEED, TEM, and electrical measurements indicated that the underlying GaAs layer given by this approach is functionally identical to the starting GaAs buffer layer.

This control of coverage thickness uniformity and defect density makes possible the realization of high electrical quality strained layer materials (i.e. high carrier lifetime values, no Fermi level pinning interface state densities of less that $10^{10}/cm^2$), which in turn make possible a variety of devices including n- and p-type HEMT's (high electron or hole mobility transistors), spatial light modulators (SLMs) and a number of quantum well or sub-band devices for application as IR sensors. Also, the tetragonally distorted InAs material shows signs of being a superconductor in the 20 to 80 K. range, thereby making possible the implementation of Josephson devices.

The process of the invention has direct application to all lattice mismatched epitaxial growth processes which are based on reactive deposition of thin films at the growth interface. Some of these include InAs and InGaAs on InP, InAsSb/InAs, InAsSb/GaAs, InAs/AlAs/GaAs, Ge and GeSi on Si or Ge, TmSi/Si, etc., where TmSi refers to transition metal silicide. In all cases, the local configuration of the substrate atom incorporation site, chemical state of the reactants, and the surface diffusion or migration rate of the various precursors all must be controlled in order to force the uniform epitaxial growth of the desired surface crystalline phase.

We claim:

1. A method of growing strained thin films of InAs on a substrate selected from the group consisting of III-V compound semiconductors and Group IV elemental semiconductors by molecular beam epitaxy using growth front control, said InAs having a different composition than said substrate, in which introduction of a specific elemental species is controlled by sequentially opening shutters for each species for a period of time, the method comprising introducing a period of delay before opening each shutter in order to permit specific reactions to occur and thereby control the stoichiometry of said growth front as follows:
    (a) exposing the surface of said substrate to $As_4$ for a period of time to smooth said surface;
    (b) forming about 0.01 to 0.5 monolayers of Ga on said $As_4$-smoothed substrate;
    (c) forming about 2 monolayers of In on said substrate;
    (d) delaying for a period of time, then forming about 1 monolayer of As on said substrate; and
    (e) repeating steps (c) and (d) as needed to form a plurality of InAs layers.

2. The method of claim 1 wherein said substrate consists essentially of a material selected from the group consisting of GaAs, InP, InAs, Si, and Ge.

3. The method of claim 6 wherein
    (a) said surface smoothing is achieved by exposing said substrate to $As_4$ for several minutes;
    (b) said Ga is formed on said surface by exposing said surface to a pulse of Ga ranging from about 0.1 to 0.5 seconds;
    (c) said In is formed on said surface by exposing said surface to a pulse of In ranging from about 0.9 to 4 seconds; and
    (d) delaying said As exposure by about 0.2 to 3 seconds, then exposing said surface to a pulse of $As_4$ ranging from about 0.2 to 2 seconds.

4. The method of claim 1 wherein a plurality of GaAs layers are formed on said plurality of InAs layers by simultaneously forming about 1 monolayer each of Ga and As on said substrate, and repeating such formation following a period of delay.

5. The process of claim 4 in which said period of delay ranges from about 0.5 seconds to 2 minutes.

6. A method of growing strained thin films of InAs on a GaAs substrate by molecular beam epitaxy using growth front control, in which initial introduction of As and Ga to control step density on said GaAs substrate and in which introduction of In and As species is controlled by sequentially opening shutters in order to permit specific reactions to occur and thereby control the stoichiometry of said growth front as follows:
    (a) exposing the surface of said GaAs substrate to $As_4$ for a period of time to smooth said surface;
    (b) forming about 0.01 to 0.5 monolayers of Ga on said $As_4$-smoothed substrate;
    (c) forming about 2 monolayers of In on said substrate;
    (d) delaying for a period of time, then forming about 1 monolayer of As on said substrate; and
    (e) repeating steps (c) and (d) as needed to form a plurality of InAs layers.

7. The method of claim 6 wherein
    (a) said surface smoothing is achieved by exposing said substrate to $As_4$ for several minutes;
    (b) said Ga is formed on said surface by exposing said surface to a pulse of Ga ranging from about 0.1 to 0.5 seconds;
    (c) said In is formed on said surface by exposing said surface to a pulse of In ranging from about 0.9 to 4 seconds; and
    (d) delaying said $As_4$ exposure by about 0.2 to 3 seconds, then exposing said surface to a pulse of $As_4$ ranging from about 0.2 to 2 seconds.

8. The method of claim 6 wherein a plurality of GaAs layers are formed on said plurality of InAs layers by simultaneously forming about 1 monolayer each of Ga and As on said substrate, and repeating such formation following a period of delay.

9. The process of claim 8 in which said period of delay ranges from about 0.5 seconds to 2 minutes.

* * * * *